US012791617B2

(12) United States Patent
Syouda

(10) Patent No.: US 12,791,617 B2
(45) Date of Patent: Nov. 10, 2026

(54) STORAGE BATTERY CONTROL DEVICE, POWER STORAGE SYSTEM, AND STORAGE BATTERY CONTROL METHOD

(71) Applicant: YAZAKI CORPORATION, Tokyo (JP)

(72) Inventor: Takahiro Syouda, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 880 days.

(21) Appl. No.: 18/300,397

(22) Filed: Apr. 14, 2023

(65) Prior Publication Data

US 2023/0378772 A1 Nov. 23, 2023

(30) Foreign Application Priority Data

May 17, 2022 (JP) ................................ 2022-080671

(51) Int. Cl.
*G01R 31/3842* (2019.01)
*G01R 31/392* (2019.01)
(Continued)

(52) U.S. Cl.
CPC ....... *G01R 31/3842* (2019.01); *G01R 31/392* (2019.01); *H01M 10/441* (2013.01); (Continued)

(58) Field of Classification Search
CPC ........ H02J 7/00; H02J 7/50; H02J 7/54; H02J 7/80; H02J 7/82; H02J 7/84; H02J 3/32; (Continued)

(56) References Cited

U.S. PATENT DOCUMENTS 5,828,201 A * 10/1998 Hoffman, Jr ............. B60K 6/28 903/903
8,136,454 B2 * 3/2012 Barbee ...................... B60L 7/24 105/49
(Continued)

FOREIGN PATENT DOCUMENTS

JP 2012-253849 A 12/2012
JP 2013-148452 A 8/2013
(Continued)

*Primary Examiner* — Julian D Huffman
*Assistant Examiner* — Johali A Torres Ruiz
(74) *Attorney, Agent, or Firm* — KENEALY VAIDYA LLP

(57) ABSTRACT

The present disclosure relates to a storage battery control device, a power storage system, and a storage battery control method. The storage battery control device controls a power storage system including storage battery strings each including storage batteries and connected with each other by a power line, the storage batteries being connected in series, and power converters each provided between the storage battery string and the power line and converting an input and output voltage of the storage battery string. The storage battery control device discharges a target storage battery to a buffer string or an outside of the power storage system to measure a discharge current or a voltage of the target storage battery, and estimates a state of the target storage battery based on the measured discharge current or the measured voltage of the target storage battery.

8 Claims, 6 Drawing Sheets

(51) Int. Cl.
*H01M 10/44* (2006.01)
*H02J 7/54* (2026.01)
*H02J 7/82* (2026.01)
*H02J 7/84* (2026.01)

(52) U.S. Cl.
CPC *H02J 7/54* (2026.01); *H02J 7/82* (2026.01); *H02J 7/84* (2026.01)

(58) Field of Classification Search
CPC ............. G01R 31/3842; G01R 31/392; H01M 10/441; H01M 10/48; H01M 10/482; H01M 10/4207; H01M 10/4257; H01M 10/4285
See application file for complete search history.

(56) References Cited

U.S. PATENT DOCUMENTS

| | | | | |
|---|---|---|---|---|
| 11,322,966 | B1 * | 5/2022 | Tian | H02J 7/40 |
| 2020/0233479 | A1 * | 7/2020 | Tsukamoto | G06F 1/206 |
| 2021/0168964 | A1 * | 6/2021 | Nakaya | H01M 10/425 |
| 2021/0234380 | A1 | 7/2021 | Ono et al. | |
| 2022/0200314 | A1 * | 6/2022 | Zhou | H02J 7/50 |
| 2023/0039175 | A1 * | 2/2023 | Tanaka | B60L 58/13 |

FOREIGN PATENT DOCUMENTS

| | | | |
|---|---|---|---|
| JP | 2017-138241 | A | 8/2017 |
| JP | 6520124 | B2 | 5/2019 |
| JP | 2021-071320 | A | 5/2021 |
| JP | 2021-118636 | A | 8/2021 |
| JP | 2022-021070 | A | 2/2022 |

* cited by examiner

STORAGE BATTERY CONTROL DEVICE, POWER STORAGE SYSTEM, AND STORAGE BATTERY CONTROL METHOD

CROSS-REFERENCE TO RELATED APPLICATIONS

This application is based on and claims priority under 35 USC 119 from Japanese Patent Application No. 2022-080671 filed on May 17, 2022, the contents of which are incorporated herein by reference.

TECHNICAL FIELD

The present invention relates to a storage battery control device, a power storage system, and a storage battery control method.

BACKGROUND ART

A state of health (SOH) estimation device that estimates an SOH indicating a degree of health of a battery is known (for example, see JP2013-148452A). In the SOH estimation device disclosed in JP2013-148452A, when charging of the battery is completed, a voltage of the battery is acquired from a voltage detection unit, measurement of a polarization recovery time is started, and when a difference between the acquired voltage and a voltage acquired again is equal to or greater than a predetermined voltage, the measurement of the polarization recovery time ends. In the SOH estimation device, the SOH of the battery is estimated based on the measured polarization recovery time.

In a power storage system including the SOH estimation device disclosed in JP2013-148452A, since a current of each storage battery changes while input and output are performed according to a request of a power supply destination, the estimation of the SOH cannot be accurately performed. Therefore, depending on a request for the input and output to and from the power storage system, the estimation of the SOH cannot be performed. Alternatively, the input and output of the power storage system are limited during a period in which the estimation of the SOH is performed.

SUMMARY OF INVENTION

The present disclosure provides a storage battery control device, a power storage system, and a storage battery control method capable of accurately estimating a state such as an SOH and a state of charge (SOC) of a storage battery regardless of a state of an input and output request to and from the power storage system.

An aspect of the present disclosure, a storage battery control device controls a power storage system. The power storage system includes a plurality of storage battery strings each including a plurality of storage batteries and connected with each other by a power line, the plurality of storage batteries being connected in series, and a plurality of power converters each provided between the storage battery string and the power line and configured to convert an input and output voltage of the storage battery string. The storage battery control device is configured to determine target storage battery that are the storage batteries whose state is to be estimated, determine a buffer string that is one of the storage battery strings and configured to receive discharge power of the target storage battery from the plurality of storage battery strings excluding a target string that is one of the storage battery strings including the target storage battery, charge the target storage battery, discharges the buffer string to ensure a capacity capable of receiving the discharge power of the target storage battery in the buffer string, discharge the target storage battery to the buffer string or an outside of the power storage system to measure at least one of a discharge current and a voltage of the target storage battery, and estimate a state of the target storage battery based on at least one of the measured discharge current and the measured voltage of the target storage battery.

An aspect of the present disclosure, a storage battery control device that controls a power storage system. The power storage system includes a plurality of storage battery strings each including a plurality of storage batteries and connected with each other by a power line, the plurality of storage batteries being connected in series, and a plurality of power converters each provided between the storage battery string and the power line and configured to convert an input and output voltage of the storage battery string. The storage battery control device is configured to determine target storage battery that are the storage batteries whose state is to be estimated, determine a buffer string that is one of the storage battery strings and configured to provide charge power of the target storage battery from the plurality of storage battery strings excluding a target string that is one of the storage battery strings including the target storage battery, discharge the target storage battery, charge the buffer string to ensure a capacity capable of providing the charge power of the target storage battery in the buffer string, discharge the buffer string or an outside of the power storage system to the target storage battery to measure at least one of a charge current and a voltage of the target storage battery, and estimate a state of the target storage battery based on at least one of the measured charge current and the measured voltage of the target storage battery.

An aspect of the present disclosure, a power storage system includes a plurality of storage battery strings each including a plurality of storage batteries and connected with each other by a power line, the plurality of storage batteries being connected in series, a plurality of power converters each provided between the storage battery string and the power line and configured to convert an input and output voltage of the storage battery string, and a storage battery control device configured to control the plurality of storage battery strings and the plurality of power converters. The storage battery control device is configured to determine a target storage battery that is one of the storage batteries whose state is to be estimated, determines a buffer string that is one of the storage battery strings and configured to receive discharge power of the target storage battery from the plurality of storage battery strings excluding a target string that is one of the storage battery strings including the target storage battery, charge the target storage battery, discharge the buffer string to ensure a capacity capable of receiving the discharge power of the target storage battery in the buffer string, discharge the target storage battery to the buffer string or an outside of the power storage system to measure at least one of a discharge current and a voltage of the target storage battery, and estimate a state of the target storage battery based on at least one of the measured discharge current and the measured voltage of the target storage battery.

An aspect of the present disclosure, a power storage system includes a plurality of storage battery strings each including a plurality of storage batteries and connected with each other by a power line, the plurality of storage batteries being connected in series, a plurality of power converters each provided between the storage battery string and the power line and configured to convert an input and output voltage of the storage battery string, and a storage battery control device configured to control the plurality of storage battery strings and the plurality of power converters. The storage battery control device is configured to determine a target storage battery that are the storage batteries whose state is to be estimated, determine a buffer string that is one of the storage battery strings and configured to provide charge power of the target storage battery from the plurality of storage battery strings excluding a target string that is one of the storage battery strings including the target storage battery, discharge the target storage battery, charge the buffer string to ensure a capacity capable of providing the charge power of the target storage battery in the buffer string, discharge the buffer string or an outside of the power storage system to the target storage battery to measure at least one of a charge current and a voltage of the target storage battery, and estimate a state of the target storage battery based on at least one of the measured charge current and the measured voltage of the target storage battery.

An aspect of the present disclosure, a storage battery control method is executed by using a storage battery control device configured to control a power storage system. The power storage system includes a plurality of storage battery strings each including a plurality of storage batteries and connected with each other by a power line, the plurality of storage batteries being connected in series, and a plurality of power converters each provided between the storage battery string and the power line and configured to convert an input and output voltage of the storage battery string. The storage battery control method includes determining a target storage battery that is one of the storage batteries whose state is to be estimated, determining a buffer string that is one of the storage battery strings and configured to receive discharge power of the target storage battery from the plurality of storage battery strings excluding a target string that is one of the storage battery string including the target storage battery, charging the target storage battery, discharging the buffer string to ensure a capacity capable of receiving the discharge power of the target storage battery in the buffer string, discharging the target storage battery to the buffer string or an outside of the power storage system to measure at least one of a discharge current and a voltage of the target storage battery, and estimating a state of the target storage battery based on at least one of the measured discharge current and the measured voltage of the target storage battery.

An aspect of the present disclosure, a storage battery control method is executed by using a storage battery control device configured to control a power storage system. The power storage system includes a plurality of storage battery strings each including a plurality of storage batteries and connected with each other by a power line, the plurality of storage batteries being connected in series, and a plurality of power converters each provided between the storage battery string and the power line and configured to convert an input and output voltage of the storage battery string. The storage battery control method includes determining a target storage battery that is one of the storage batteries whose state is to be estimated, determining a buffer string that is one of the storage battery string and configured to provide charge power of the target storage battery from the plurality of storage battery strings excluding a target string that is one of the storage battery string including the target storage battery, discharging the target storage battery, charging the buffer string to ensure a capacity capable of providing the charge power of the target storage battery in the buffer string, discharging the buffer string or an outside of the power storage system to the target storage battery to measure at least one of a charge current and a voltage of the target storage battery, and estimating a state of the target storage battery based on at least one of the measured charge current and the measured voltage of the target storage battery.

According to the present disclosure, the state of the storage battery such as an SOH and an SOC can be accurately estimated regardless of the state of the input and output request to and from the power storage system.

DESCRIPTION OF EMBODIMENTS

The present disclosure will be described below in accordance with a preferred embodiment. Also, it should be noted that the present disclosure is not limited to the embodiment to be illustrated below, and the embodiment can be appropriately modified without departing from the gist of the present disclosure. In addition, in the embodiment illustrated below, illustration and description of some configurations are omitted, but regarding details of the omitted techniques, publicly known or well-known techniques are appropriately applied as long as there is no contradiction with the contents described below.

Figure 1:
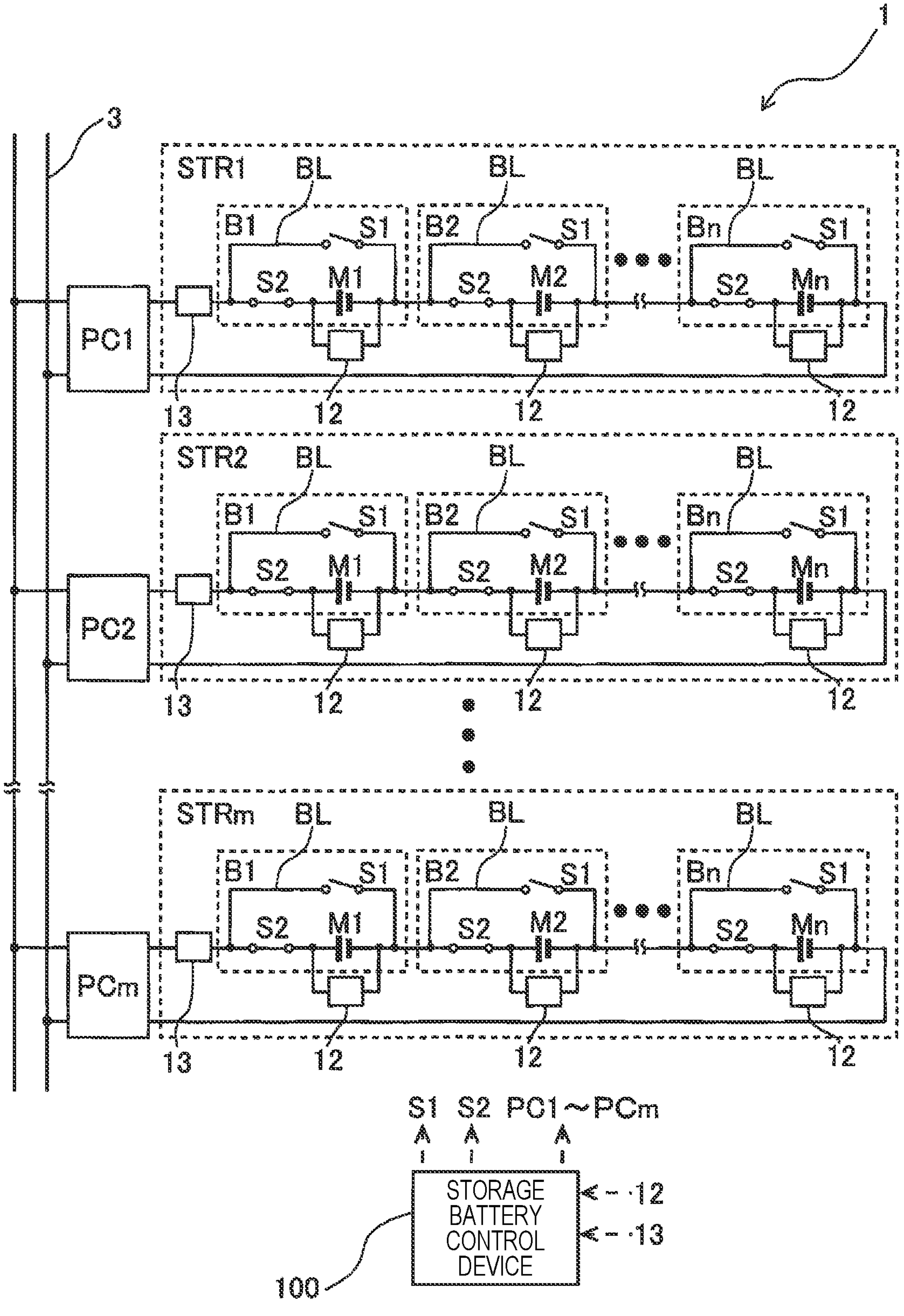
FIG. 1 is a circuit diagram schematically illustrating a power storage system including a storage battery control device according to an embodiment of the present disclosure.

FIG. 1 is a circuit diagram schematically illustrating a power storage system 1 including a storage battery control device 100 according to an embodiment of the present disclosure. As illustrated in FIG. 1, the power storage system 1 includes m (m is an integer of three or more) sets of storage battery strings STR1 to STRm, a string bus 3, m power converters PC1 to PCm, and the storage battery control device 100. The m sets of storage battery strings STR1 to STRm are connected to one another via the m power converters PC1 to PCm and the string bus 3 and are connected to an external system (not illustrated). The power storage system 1 is a stationary or in-vehicle power supply.

Each of the storage battery strings STR1 to STRm includes n (n is an integer of two or more) storage battery modules M1 to Mn connected in series. Although not particularly limited, the storage battery strings STR1 to STRm according to the present embodiment are those obtained by reproducing used storage batteries, and there is a difference in deterioration degrees of the storage battery modules M1 to Mn. The storage battery modules M1 to Mn are, for example, secondary batteries such as a lithium ion battery and a lithium ion capacitor.

The storage battery modules M1 to Mn are charged with power supplied from the external system through the string bus 3 and the power converters PC1 to PCm, and discharge the charged power through the power converters PC1 to PCm and the string bus 3 to supply the power to the external system. As will be described later, the storage battery modules M1 to Mn are charged with power supplied from the other storage battery strings STR1 to STRm through the string bus 3 and the power converters PC1 to PCm, and discharge the charged power to charge the storage battery modules M1 to Mn of the other storage battery strings STR1 to STRm through the power converters PC1 to PCm and the string bus 3.

The external system includes a load, a generator, and the like. When the power storage system 1 is stationary, a household electrical appliance, a commercial power supply system, a liquid crystal display, a communication module, and the like serve as the load, and a solar photovoltaic power generation system or the like serves as the generator. In contrast, when the power storage system 1 is used in a vehicle, a drive motor, an air conditioner, various in-vehicle electrical components, and the like serve as the load. The drive motor serves as the load and also as the generator.

The storage battery strings STR1 to STRm may include n storage battery cells or storage battery packs connected in series instead of the n storage battery modules M1 to Mn connected in series. Further, the power storage system 1 may include a bypass circuit that bypasses each storage battery cell or each storage battery pack.

The power converters PC1 to PCm are DC/DC converters or DC/AC converters, and are connected to the string bus 3. Further, a positive electrode of the storage battery module M1 at a beginning and a negative electrode of the storage battery module Mn at an end are connected to each of the power converters PC1 to PCm.

When the storage battery strings STR1 to STRm are charged, the power converters PC1 to PCm convert a voltage input from the string bus 3 and output the converted voltage to a plurality of storage battery modules M1 to Mn. In contrast, when the storage battery strings STR1 to STRm are discharged, the power converters PC1 to PCm convert the voltage input from the plurality of storage battery modules M1 to Mn and output the converted voltage to the string bus 3. When a current flowing through the string bus 3 is DC, the power converters PC1 to PCm are the DC/DC converters, and when the current flowing through the string bus 3 is AC, the power converters PC1 to PCm are the DC/AC converters. When the current flowing through the string bus 3 is DC, each of the power converters PC1 to PCm includes a synchronizing unit to track a change in instantaneous values.

Each of the storage battery strings STR1 to STRm includes n voltage sensors 12, a current sensor 13, and n bypass circuits B1 to Bn. The voltage sensor 12 is connected between positive and negative electrode terminals of each of the storage battery modules M1 to Mn. The voltage sensor 12 measures an inter-terminal voltage of each of the storage battery modules M1 to Mn.

The current sensor 13 is provided in a current path of the storage battery strings STR1 to STRm. The current sensor 13 measures a charge and discharge current of the storage battery strings STR1 to STRm.

The bypass circuits B1 to Bn are set for each storage battery modules M1 to Mn. Each of the bypass circuits B1 to Bn includes a bypass line BL and switches S1 and S2. The bypass line BL is a power line that bypasses each of the storage battery modules M1 to Mn. The switch S1 is provided in the bypass line BL. The switch S1 is, for example, a mechanical switch. The switch S2 is provided between a positive electrode of each of the storage battery modules M1 to Mn and one end of the bypass line BL. The switch S2 is, for example, a semiconductor switch or a relay.

The storage battery modules M1 at the beginning and the storage battery modules Mn at the end are connected to the external system via the power converters PC1 to PCm and the string bus 3. When the switches S1 are open and the switches S2 are closed in all the bypass circuits B1 to Bn, all the storage battery modules M1 to Mn are connected in series to the external system. On the other hand, when the switches S2 are opened and the switches S1 are closed in any of the bypass circuits B1 to Bn, the storage battery modules M1 to Mn corresponding to the bypass circuits B1 to Bn are bypassed.

The storage battery control device 100 is connected to the storage battery strings STR1 to STRm, the bypass circuits B1 to Bn, and the power converters PC1 to PCm, and executes monitoring and control of the storage battery modules M1 to Mn, switching control of the bypass circuits B1 to Bn, and charge and discharge control by the power converters PC1 to PCm. In particular, the storage battery control device 100 according to the present embodiment executes estimation of a battery state (hereinafter referred to as state estimation) such as SOH and SOC of the storage battery modules M1 to Mn based on voltages detected by the voltage sensors 12 and currents detected by the current sensors 13.

Examples of a method of estimating the SOH include a method based on a charge and discharge test, a method based on a current integration method, a method based on measurement of an open circuit voltage, a method based on measurement of a terminal voltage, a method based on a model (the above methods use a temporal change in the SOC), a method based on AC impedance measurement, a method based on a model and for estimating by an adaptive digital filter, a method based on linear regression (an inclination of a straight line of I-V characteristics) from the I-V characteristics (current-voltage characteristics), and a method based on a step response (the above methods are methods for estimation by using a temporal increase in internal resistance).

Examples of a method of estimating the SOC include various known methods such as a current integration method, a method (voltage method) obtained from an open circuit voltage (OCV), and a method combining the current integration method and the voltage method. In addition, the OCV can be estimated by using various known methods of estimation by using a temporal change in the terminal voltage or a temporal increase in the internal resistance.

The power storage system 1 according to the present embodiment records an integrated value of a discharge current and a voltage of a storage battery module $M_{\_target}$ which is a state estimation target (hereinafter referred to as a target storage battery module), generates an SOC-OCV curve based on the recorded values, and estimates the SOH from the generated SOC-OCV curve.

Here, the power storage system 1 according to the present embodiment estimates a state of the target storage battery module $M_{\_target}$ while continuing an output from the power storage system 1 to the external system and an input from the external system to the power storage system 1. Hereinafter, state estimation processing on the target storage battery module $M_{\_target}$ performed by the storage battery control device 100 will be described.

Figure 2:
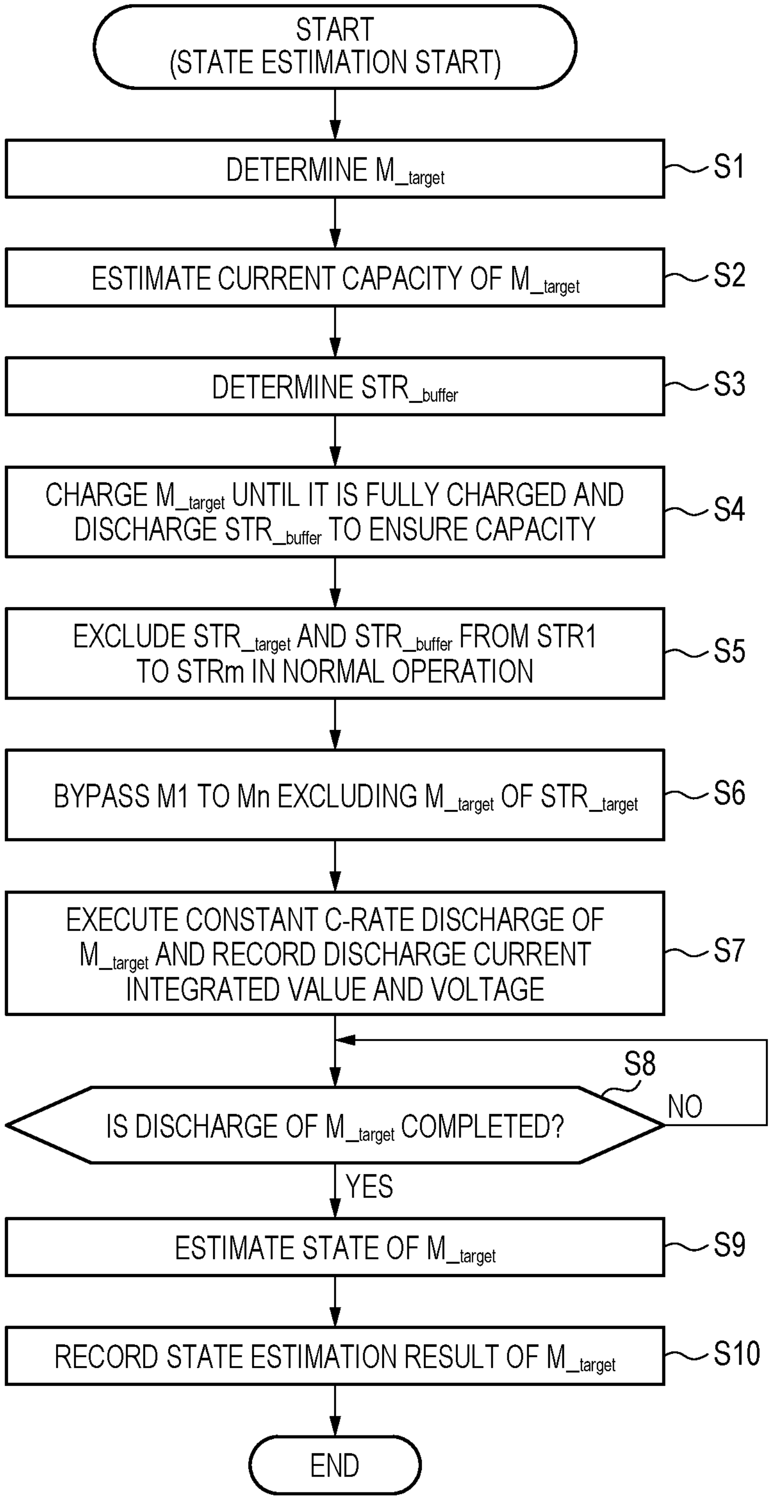
FIG. 2 is a flowchart illustrating state estimation processing on a target storage battery module performed by the storage battery control device in FIG. 1.

FIG. 2 is a flowchart illustrating the state estimation processing on the target storage battery module $M_{\_target}$ performed by the storage battery control device 100 in FIG. 1. As illustrated in the flowchart in FIG. 2, the storage battery control device 100 determines one target storage battery module $M_{\_target}$ from the m sets of storage battery strings STR1 to STRm in step S1. Examples of a method of determining one target storage battery module $M_{\_target}$ include a method of determination in a predetermined order, a method of determining the target storage battery module $M_{\_target}$ as the storage battery modules M1 to Mn in which the integrated value of the charge and discharge current reaches a predetermined value, and a method of determining the target storage battery module $M_{\_target}$ as the storage battery modules M1 to Mn in which an error of the state estimation exceeds a threshold.

Next, in step S2, the storage battery control device 100 estimates a current battery capacity of the target storage battery module $M_{\_target}$ determined in step S1. Here, the storage battery control device 100 records an estimation result every time the state estimation of the target storage battery module $M_{\_target}$ is executed. Therefore, the storage battery control device 100 estimates the current battery capacity of the target storage battery module $M_{\_target}$ based on the recorded result of the state estimation of the target storage battery module $M_{\_target}$.

Next, in step S3, the storage battery control device 100 determines a storage battery string (hereinafter, referred to as a buffer string) $STR_{\_buffer}$ that receives discharge power of the target storage battery module $M_{\_target}$ from the m sets of storage battery strings STR1 to STRm. The buffer string $STR_{\_buffer}$ is determined from the storage battery strings STR1 to STRm excluding a storage battery string (hereinafter referred to as a target string) $STR_{\_target}$ including the target storage battery module $M_{\_target}$. Here, the buffer string $STR_{\_buffer}$ is determined on a condition that a battery capacity equal to or larger than the battery capacity of the target storage battery module $M_{\_target}$ can be ensured. A plurality of storage battery strings STR1 to STRm may be determined as the buffer string $STR_{\_buffer}$.

Next, in step S4, by controlling the bypass circuits B1 to Bn and the power converters PC1 to PCm, the storage battery control device 100 charges the target storage battery module $M_{\_target}$ to a fully charged state while normally executing operations of the power storage system 1 (the output to the external system and the input from the external system). By controlling the power converters PC1 to PCm, the storage battery control device 100 discharges the buffer string $STR_{\_buffer}$ to ensure a free capacity in the buffer string $STR_{\_buffer}$ while normally executing the operations of the power storage system 1. The free capacity is equal to or larger than the battery capacity of the target storage battery module $M_{\_target}$, and is set by the storage battery control device 100 based on an estimation result of the current battery capacity of the target storage battery module $M_{\_target}$ in step S2.

Next, in step S5, the storage battery control device 100 excludes the target string $STR_{\_target}$ and the buffer string $STR_{\_buffer}$ from the storage battery strings STR1 to STRm used in the normal operation of the power storage system 1. That is, by controlling the power converters PC1 to PCm, the storage battery control device 100 continues the normal operation by using the storage battery strings STR1 to STRm excluding the target string $STR_{\_target}$ and the buffer string $STR_{\_buffer}$.

Next, in step S6, the storage battery control device 100 bypasses the storage battery modules M1 to Mn excluding the target storage battery module $M_{\_target}$ of the target string $STR_{\_target}$ by the bypass circuits B1 to Bn. Next, in step S7, the storage battery control device 100 starts constant C-rate discharge at a low current by the target storage battery module $M_{\_target}$. The storage battery control device 100 records the integrated value of the discharge current and the voltage of the target storage battery module $M_{\_target}$ during the discharge of the target storage battery module $M_{\_target}$.

Here, when there is an output request from the power storage system 1 to the external system, the storage battery control device 100 controls the power converters PC1 to PCm such that the target storage battery module $M_{\_target}$ is discharged to the external system. On the other hand, when there is no output request from the external system to the power storage system 1, the storage battery control device 100 controls the power converters PC1 to PCm such that the target storage battery module $M_{\_target}$ is discharged to the buffer string $STR_{\_buffer}$.

Next, in step S8, the storage battery control device 100 determines whether the discharge of the target storage battery module $M_{\_target}$ is completed. Until an affirmative determination is made in step S8, the discharge of the target storage battery module $M_{\_target}$ is continued, and the recording of the integrated value of the discharge current and the voltage of the target storage battery module $M_{\_target}$ is continued. When the affirmative determination is made in step S8, the processing proceeds to step S9.

In step S9, the storage battery control device 100 estimates the state of the target storage battery module $M_{\_target}$ based on the recorded integrated value of the discharge current and recorded the voltage of the target storage battery module $M_{\_target}$. Examples of the state estimation include estimation of the SOH and the generation of the SOC-OCV curve. Next, in step S10, the storage battery control device 100 records the result of the state estimation of the target storage battery module $M_{\_target}$ in step S9. Thus, the processing illustrated in the flowchart in FIG. 2 is ended.

The storage battery control device 100 repeats the processing of steps S1 to S10, and executes the state estimation on all the storage battery modules M1 to Mn included in the power storage system 1. A frequency of executing the state estimation of the storage battery modules M1 to Mn may be set in accordance with a progress of deterioration of the storage battery modules M1 to Mn. For example, when the progress of the deterioration of the storage battery modules M1 to Mn is slow, the state estimation of the storage battery modules M1 to Mn may be executed once every several months to half a year.

Further, the storage battery control device 100 executes various calculations based on the updated result of the state estimation after returning from the state estimation processing on the target storage battery module $M_{\_target}$ to a time of the normal operation of the power storage system 1. For example, the storage battery control device 100 executes the estimation of the SOH based on the SOC-OCV curve updated in the processing, calculation of a capacity of the storage battery modules M1 to Mn based on the SOH updated in the processing, and the like.

As described above, the storage battery control device 100 according to the present embodiment determines the target storage battery module $M_{\_target}$ whose state is to be estimated. In addition, the storage battery control device 100 determines the buffer string $STR_{\_buffer}$ from the plurality of storage battery strings STR1 to STRm excluding the target string $STR_{\_target}$ including the target storage battery module $M_{\_target}$. The buffer string $STR_{\_buffer}$ receives the discharge power of the target storage battery module $M_{\_target}$. The storage battery control device 100 charges the target storage battery module $M_{\_target}$ and discharges the buffer string $STR_{\_buffer}$ to ensure a capacity capable of receiving the discharge power of the target storage battery module $M_{\_target}$ in the buffer string $STR_{\_buffer}$. The storage battery control device 100 discharges the target storage battery module M_*target* to the buffer string $STR_{\_buffer}$ or the external system to measure the discharge current and the voltage of the target storage battery module $M_{\_target}$. Then, the storage battery control device 100 estimates the state of the target storage battery module $M_{\_target}$ based on the measured discharge current and the measured voltage of the target storage battery module $M_{\_target}$.

Here, during the state estimation processing, the storage battery strings STR1 to STRm other than the target string $STR_{\_target}$ are operated according to a request of the input and output to and from the power storage system 1, and change the charge and discharge current. In contrast, during the state estimation processing, the target storage battery module $M_{\_target}$ is discharged at a constant C-rate to the buffer string $STR_{\_buffer}$ or the external system regardless of the request of the input and output to and from the power storage system 1. Accordingly, during the state estimation processing, a change in the discharge current of the target storage battery module $M_{\_target}$ can be reduced to be relatively small as compared with the storage battery modules M1 to Mn of the storage battery strings STR1 to STRm other than the target string $STR_{\_target}$. Therefore, according to the storage battery control device 100 of the present embodiment, the state of the target storage battery module $M_{\_target}$ can be accurately estimated regardless of a state of the request of the input and output to and from the power storage system 1.

In particular, the storage battery control device 100 according to the present embodiment determines one target storage battery module $M_{\_target}$, and charges the one target storage battery module $M_{\_target}$ in a state of bypassing the storage battery modules M1 to Mn excluding the target storage battery module $M_{\_target}$ of the target string $STR_{\_target}$ by the bypass circuits B1 to Bn. Then, the storage battery control device 100 discharges the target storage battery module $M_{\_target}$ to the buffer string STR barer or the external system to measure the discharge current and the voltage of the target storage battery module $M_{\_target}$ in the state of bypassing the storage battery modules M1 to Mn excluding the target storage battery module $M_{\_target}$ of the target string $STR_{\_target}$ by the bypass circuits B1 to Bn.

Here, while the power storage system 1 is executing the normal operation according to the request of the input and output to and from the external system, in the storage battery strings STR1 to STRm used in the normal operation, bypass of the storage battery modules M1 to Mn due to the bypass circuits B1 to Bn is generated. Every time the bypass is generated, a discharge current and a voltage of the storage battery modules M1 to Mn change. In contrast, in the power storage system 1 according to the present embodiment, during the state estimation processing, the target string $STR_{\_target}$ including the target storage battery module $M_{\_target}$ is excluded from the storage battery strings STR1 to STRm used in the normal operation during the state examination processing. In addition, in the target string $STR_{\_target}$ during the state estimation processing, the storage battery modules M1 to Mn excluding the target storage battery module $M_{\_target}$ are bypassed by the bypass circuits B1 to Bn, and only the target storage battery module $M_{\_target}$ is discharged. Accordingly, according to the storage battery control device 100 of the present embodiment, the constant C-rate discharge of the target storage battery module $M_{\_target}$ can be continuously executed during the state estimation processing, and the state estimation of the target storage battery module $M_{\_target}$ can be executed continuously and accurately regardless of the request state of the input and output to and from the power storage system 1.

Figure 3:
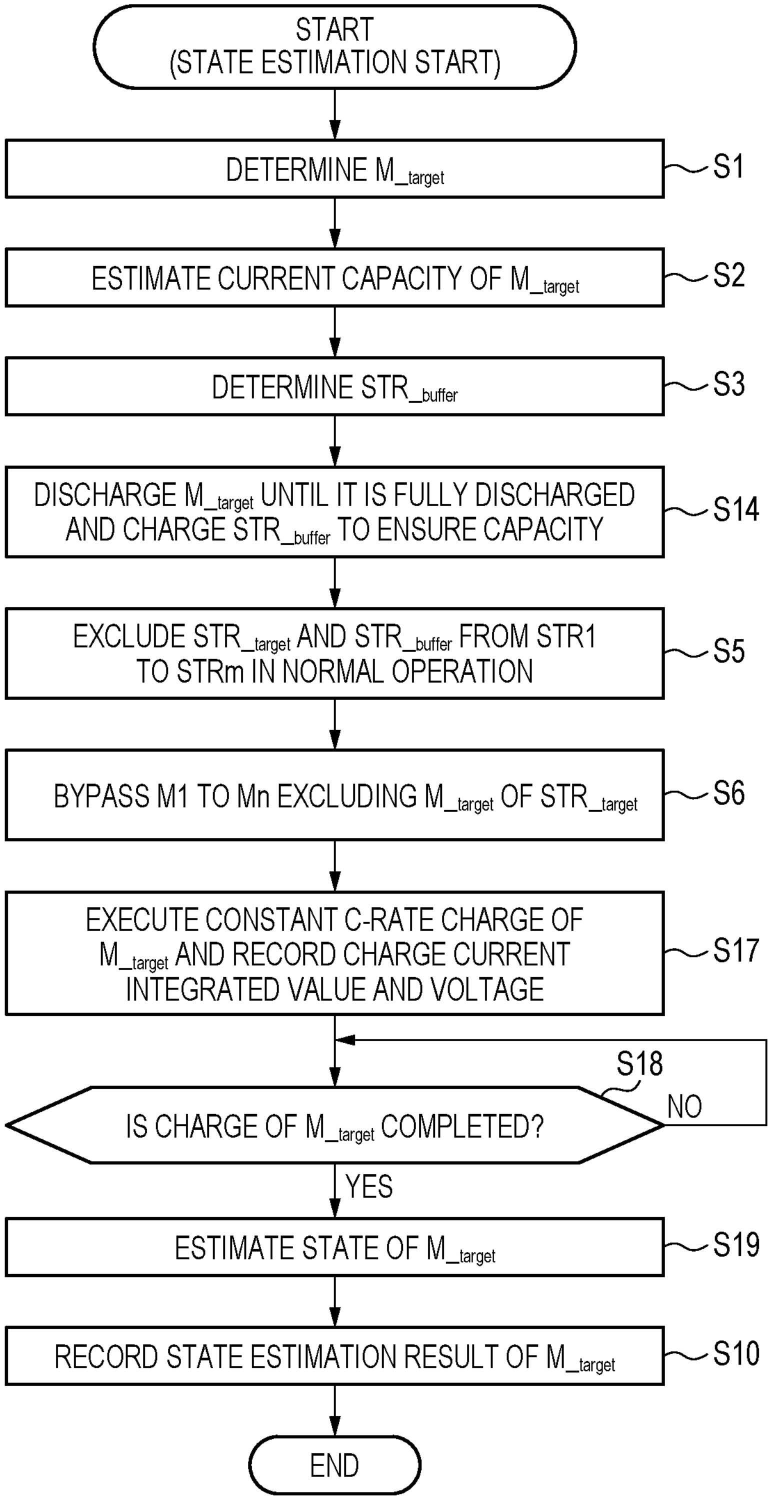
FIG. 3 is a flowchart illustrating another example of the state estimation processing on the target storage battery module performed by the storage battery control device in FIG. 1.

FIG. 3 is a flowchart illustrating another example of the state estimation processing on the target storage battery module $M_{\_target}$ by the storage battery control device 100 in FIG. 1. For the same processing as that of the above-described example, the description of the above-described example is incorporated.

As illustrated in the flowchart in FIG. 3, the storage battery control device 100 determines one target storage battery module $M_{\_target}$ from the m sets of storage battery strings STR1 to STRm in step S1. Next, in step S2, the storage battery control device 100 estimates a current battery capacity of the target storage battery module $M_{\_target}$ determined in step S1. Next, in step S3, the storage battery control device 100 determines the buffer string $STR_{\_buffer}$ from the m sets of storage battery strings STR1 to STRm.

Next, in step S14, by controlling the bypass circuits B1 to Bn and the power converters PC1 to PCm, the storage battery control device 100 discharges the target storage battery module $M_{\_target}$ to a fully discharged state while executing the normal operation of the power storage system 1. By controlling the power converters PC1 to PCm, the storage battery control device 100 charges the buffer string $STR_{\_buffer}$ to ensure a discharge capacity in the buffer string $STR_{\_buffer}$ while executing the normal operation of the power storage system 1. The discharge capacity is equal to or larger than the battery capacity of the target storage battery module $M_{\_target}$, and is set by the storage battery control device 100 based on an estimation result of the current battery capacity of the target storage battery module $M_{\_target}$ in step S2.

Next, in step S5, the storage battery control device 100 excludes the target string $STR_{\_target}$ and the buffer string $STR_{\_buffer}$ from the storage battery strings STR1 to STRm used in the normal operation of the power storage system 1. Next, in step S6, the storage battery control device 100 bypasses the storage battery modules M1 to Mn excluding the target storage battery module $M_{\_target}$ of the target string $STR_{\_target}$ by the bypass circuits B1 to Bn.

Next, in step S17, the storage battery control device 100 starts constant C-rate charge at a low current by the target storage battery module $M_{\_target}$. The storage battery control device 100 records an integrated value of a charge current and a voltage of the target storage battery module $M_{\_target}$ during the charge of the target storage battery module $M_{\_target}$.

Here, when there is an input request from the external system to the power storage system 1, the storage battery control device 100 controls the power converters PC1 to PCm such that the target storage battery module $M_{\_target}$ is charged by discharging electricity from the external system to the target storage battery module $M_{\_target}$. Here, when there is no input request from the external system to the power storage system 1, the storage battery control device 100 controls the power converters PC1 to PCm such that the target storage battery module $M_{\_target}$ is charged by discharging the buffer string $STR_{\_buffer}$ to the target storage battery module $M_{\_target}$.

Next, in step S18, the storage battery control device 100 determines whether the charge of the target storage battery module $M_{\_target}$ is completed. Until an affirmative determination is made in step S18, the charge of the target storage battery module $M_{\_target}$ is continued, and the recording of the integrated value of the charge current and the voltage of the target storage battery module $M_{\_target}$ is continued. When the affirmative determination is made in step S18, the processing proceeds to step S19.

In step S19, the storage battery control device 100 estimates the state of the target storage battery module $M_{\_target}$ based on the recorded integrated value of the charge current and the recorded voltage of the target storage battery module $M_{\_target}$. Examples of the state estimation include estimation of the SOH and the generation of the SOC-OCV curve. Next, in step S10, the storage battery control device 100 records the result of the state estimation of the target storage battery module $M_{\_target}$ in step S19. Thus, the processing illustrated in the flowchart in FIG. 3 is ended.

As described above, the storage battery control device 100 according to the present embodiment determines the target storage battery module $M_{\_target}$ whose state is to be estimated. In addition, the storage battery control device 100 determines the buffer string $STR_{\_buffer}$ from the plurality of storage battery strings STR1 to STRm excluding the target string $STR_{\_target}$ including the target storage battery module $M_{\_target}$. The buffer string $STR_{\_buffer}$ provides charge power of the target storage battery module $M_{\_target}$. The storage battery control device 100 discharges the target storage battery module $M_{\_target}$ and charges the buffer string $STR_{\_buffer}$ to ensure a capacity capable of providing the charge power of the target storage battery module $M_{\_target}$ in the buffer string $STR_{\_buffer}$. The storage battery control device 100 discharges the buffer string $STR_{\_buffer}$ or the external system to the target storage battery module $M_{\_target}$ to measure the charge current and the voltage of the target storage battery module $M_{\_target}$. Then, the storage battery control device 100 estimates the state of the target storage battery module $M_{\_target}$ based on the measured charge current and the measured voltage of the target storage battery module $M_{\_target}$.

Here, during the state estimation processing, the storage battery strings STR1 to STRm other than the target string $STR_{\_target}$ are operated according to a request of the input and output to and from the external system, and change the charge and discharge current. In contrast, during the state estimation processing, the target storage battery module $M_{\_target}$ can be supplied with power from the buffer string $STR_{\_buffer}$ or the external system and charged at the constant C-rate regardless of the request of input and output to and from the external system. Accordingly, during the state estimation processing, a change in the charge current of the target storage battery module $M_{\_target}$ can be reduced to be relatively small as compared with the storage battery modules M1 to Mn of the storage battery strings STR1 to STRm other than the target string $STR_{\_target}$. Therefore, according to the storage battery control device 100 of the present embodiment, the state of the target storage battery module $M_{\_target}$ can be accurately estimated regardless of a state of the request of the input and output to and from the power storage system 1.

In particular, the storage battery control device 100 according to the present embodiment determines one target storage battery module $M_{\_target}$, and discharges the one target storage battery module $M_{\_target}$ in a state of bypassing the storage battery modules M1 to Mn excluding the target storage battery module $M_{\_target}$ of the target string $STR_{\_target}$ by the bypass circuits B1 to Bn. Then, the storage battery control device 100 discharges the buffer string $STR_{\_buffer}$ or the external system to the target storage battery module $M_{\_target}$ to measure the charge current and the voltage of the target storage battery module $M_{\_target}$ in the state of bypassing the storage battery modules M1 to Mn excluding the target storage battery module $M_{\_target}$ of the target string $STR_{\_target}$ by the bypass circuits B1 to Bn.

Here, while the power storage system 1 is executing the normal operation according to the request of the input and output to and from the external system, in the storage battery strings STR1 to STRm used in the normal operation, bypass of the storage battery modules M1 to Mn due to the bypass circuits B1 to Bn is generated. Every time the bypass is generated, a charge current and a voltage of the storage battery modules M1 to Mn change. In contrast, in the power storage system 1 according to the present embodiment, the target string $STR_{\_target}$ including the target storage battery module $M_{\_target}$ is excluded from the storage battery strings STR1 to STRm used in the normal operation. In addition, in the target string $STR_{\_target}$ during the state estimation processing, the storage battery modules M1 to Mn excluding the target storage battery module $M_{\_target}$ are bypassed by the bypass circuits B1 to Bn, and only the target storage battery module $M_{\_target}$ is charged. Accordingly, according to the storage battery control device 100 of the present embodiment, the constant C-rate charge of the target storage battery module $M_{\_target}$ can be continuously executed during the state estimation processing, and the state estimation of the target storage battery module $M_{\_target}$ can be executed continuously and accurately regardless of the request state of the input and output to and from the power storage system 1.

Figure 4:
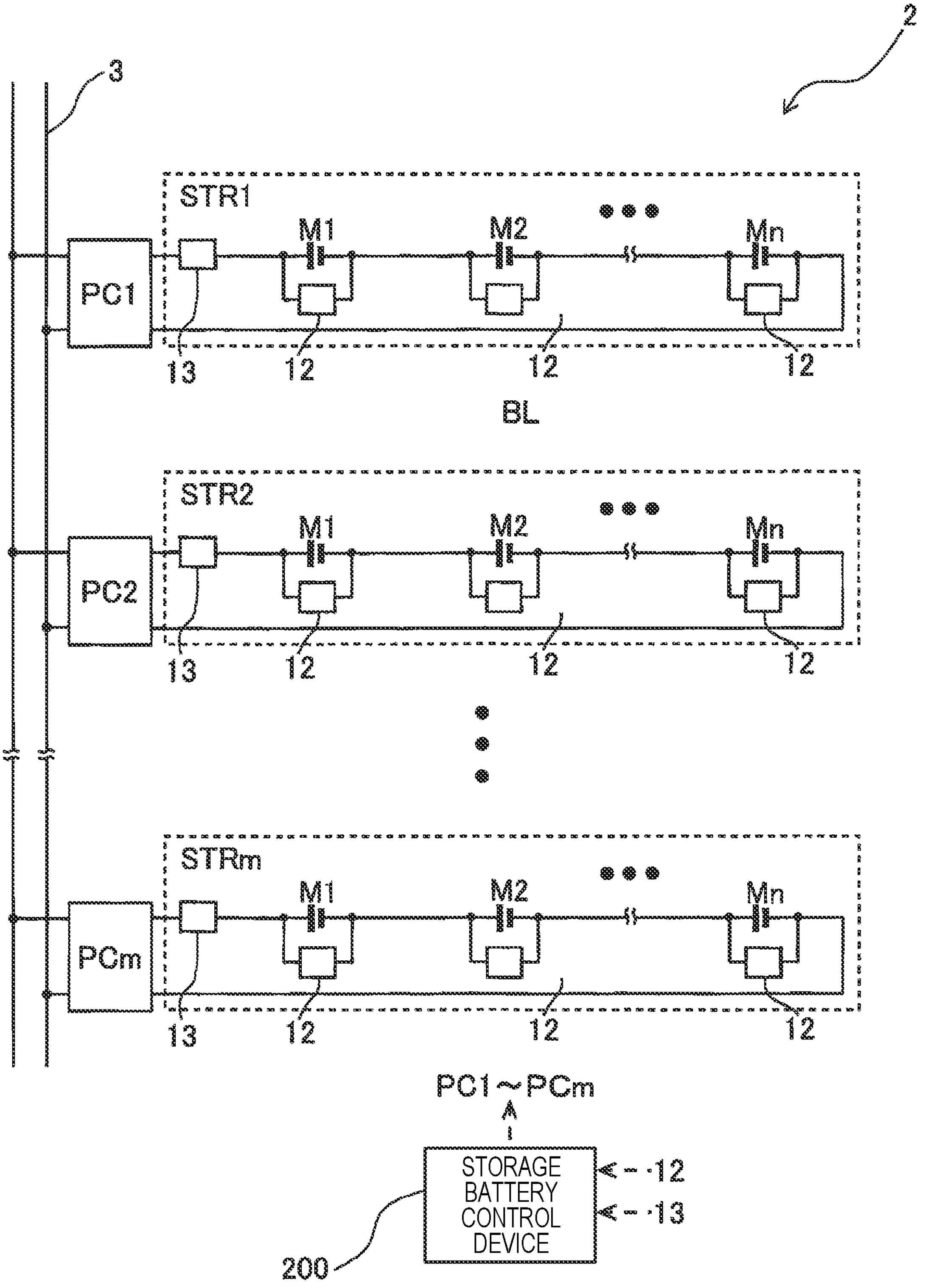
FIG. 4 is a circuit diagram schematically illustrating a power storage system including a storage battery control device according to another embodiment of the present disclosure.

FIG. 4 is a circuit diagram schematically illustrating a power storage system 2 including a storage battery control device 200 according to another embodiment of the present disclosure. The power storage system 2 illustrated in FIG. 4 is different from the power storage system 1 according to the above-described embodiment in that there is no bypass circuits B1 to Bn. The same components as those of the above-described embodiment are denoted by the same reference numerals, and the description of the above-described embodiment is incorporated.

Figure 5:
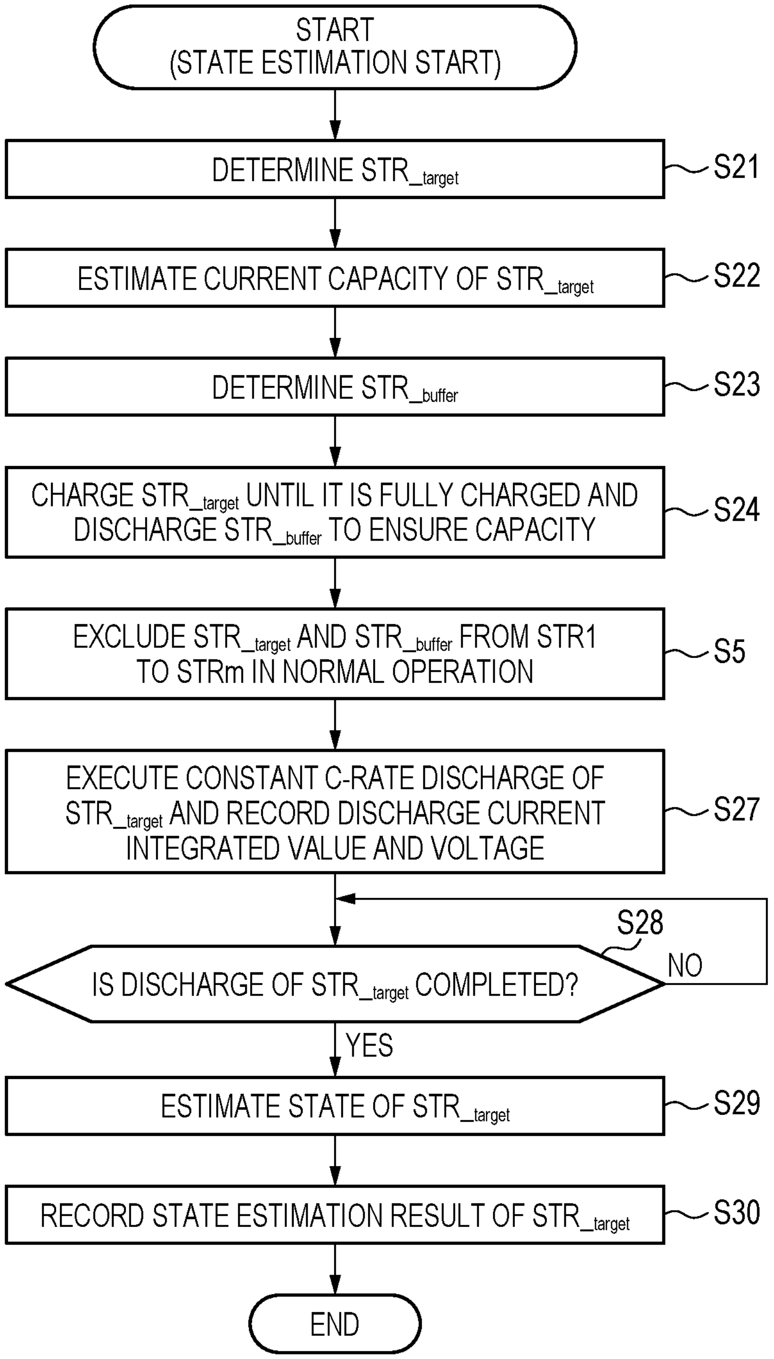
FIG. 5 is a flowchart illustrating state estimation processing on a target string performed by the storage battery control device in FIG. 4.

FIG. 5 is a flowchart illustrating state estimation processing on the target string $STR_{\_target}$ performed by the storage battery control device 200 in FIG. 4. For the same processing as that of the above-described embodiment, the description of the above-described example is incorporated.

As illustrated in the flowchart in FIG. 5, in step S21, the storage battery control device 200 determines one target string $STR_{\_target}$ from the m sets of storage battery strings STR1 to STRm. Examples of a method of determining the one target string $STR_{\_target}$ include a method of determination in a predetermined order, a method of determining the target string $STR_{\_target}$ as the storage battery strings STR1 to STRm in which an integrated value of a charge and discharge current reaches a predetermined value, and a method of determining the target string $STR_{\_target}$ as the storage battery strings STR1 to STRm in which an error of the state estimation exceeds a threshold.

Next, in step S22, the storage battery control device 200 estimates a current battery capacity of the target string $STR_{\_target}$ determined in step S21. Here, the storage battery control device 200 records an estimation result every time the state estimation of the target string $STR_{\_target}$ is executed. Therefore, the storage battery control device 200 estimates the current battery capacity of the target string $STR_{\_target}$ based on the recorded result of the state estimation of the target string $STR_{\_target}$.

Next, in step S23, the storage battery control device 200 determines the buffer string $STR_{\_buffer}$ that receives discharge power of the target string $STR_{\_target}$ from the m sets of storage battery strings STR1 to STRm. The buffer string $STR_{\_buffer}$ is determined from the storage battery strings STR1 to STRm excluding the target string $STR_{\_target}$. Here, the buffer string $STR_{\_buffer}$ is determined on a condition that a battery capacity equal to or larger than a battery capacity of the target string $STR_{\_target}$ can be ensured. A plurality of storage battery strings STR1 to STRm may be determined as the buffer string $STR_{\_buffer}$.

Next, in step S24, by controlling the power converters PC1 to PCm, the storage battery control device 200 charges the target string $STR_{\_target}$ to a fully charged state while executing a normal operation of the power storage system 1. By controlling the power converters PC1 to PCm, the storage battery control device 200 discharges the buffer string $STR_{\_buffer}$ to ensure a free capacity in the buffer string $STR_{\_buffer}$ while executing the normal operation of the power storage system 1. The free capacity is equal to or larger than the battery capacity of the target string $STR_{\_target}$, and is set by the storage battery control device 200 based on the estimation result of the current battery capacity of the target string $STR_{\_target}$ in step S22.

Next, in step S5, the storage battery control device 200 excludes the target string $STR_{\_target}$ and the buffer string $STR_{\_buffer}$ from the storage battery strings STR1 to STRm used in the normal operation of the power storage system 1. That is, by controlling the power converters PC1 to PCm, the storage battery control device 200 continues the normal operation by using the storage battery strings STR1 to STRm excluding the target string $STR_{\_target}$ and the buffer string $STR_{\_buffer}$.

Next, in step S27, the storage battery control device 200 starts constant C-rate discharge at a low current by the target string $STR_{\_target}$. The storage battery control device 200 records the integrated value of the discharge current and the voltage of the target string $STR_{\_target}$ during the discharge of the target string $STR_{\_target}$.

Here, when there is an output request from the power storage system 2 to the external system, the storage battery control device 200 controls the power converters PC1 to PCm such that the target string $STR_{\_target}$ is discharged to the external system. On the other hand, when there is no output request from the external system to the power storage system 2, the storage battery control device 200 controls the power converters PC1 to PCm such that the target string $STR_{\_target}$ is discharged to the buffer string $STR_{\_buffer}$.

Next, in step S28, the storage battery control device 200 determines whether the discharge of the target string $STR_{\_target}$ is completed. Until an affirmative determination is made in step S28, the discharge of the target string $STR_{\_target}$ is continued, and the recording of the integrated value of the discharge current and the voltage of the target string $STR_{\_target}$ is continued. When the affirmative determination is made in step S28, the processing proceeds to step S29.

In step S29, the storage battery control device 200 estimates a state of the target string $STR_{\_target}$ based on the recorded integrated value of the discharge current and the recorded voltage of the target string $STR_{\_target}$. Examples of the state estimation include estimation of the SOH and the generation of the SOC-OCV curve. Next, in step S30, the storage battery control device 200 records the result of the state estimation of the target string $STR_{\_target}$ in step S29. Thus, the processing illustrated in the flowchart in FIG. 5 is ended.

As described above, the storage battery control device 200 according to the present embodiment determines the target string $STR_{\_target}$ whose state is to be estimated. In addition, the storage battery control device 200 determines the buffer string $STR_{\_buffer}$ from the plurality of storage battery strings STR1 to STRm excluding the target string $STR_{\_target}$. The buffer string $STR_{\_buffer}$ receives the discharge power of the target string $STR_{\_target}$. The storage battery control device 200 charges the target string $STR_{\_target}$ and discharges the buffer string $STR_{\_buffer}$ to ensure a capacity capable of receiving the discharge power of the target string $STR_{\_target}$ in the buffer string $STR_{\_buffer}$. The storage battery control device 200 discharges the target string $STR_{\_target}$ to the buffer string $STR_{\_buffer}$ or the external system to measure the discharge current and the voltage of the target string $STR_{\_target}$. Then, the storage battery control device 200 estimates the state of the target string $STR_{\_target}$ based on the measured discharge current and the measured voltage of the target string $STR_{\_target}$.

Here, during the state estimation processing, the storage battery strings STR1 to STRm other than the target string $STR_{\_target}$ are operated according to a request of the input and output to and from the external system, and change the charge and discharge current. In contrast, during the state estimation processing, the target string $STR_{\_target}$ can be discharged to the buffer string $STR_{\_buffer}$ or the external system at the constant C-rate regardless of the request of the input and output to and from the external system. Accordingly, during the state estimation processing, a change in the discharge current of the target string $STR_{\_target}$ can be reduced to be relatively small as compared with the storage battery strings STR1 to STRm other than the target string $STR_{\_target}$. Therefore, according to the storage battery control device 200 of the present embodiment, the state of the target string $STR_{\_target}$ can be accurately estimated regardless of a state of the request of the input and output to and from the power storage system 1.

Figure 6:
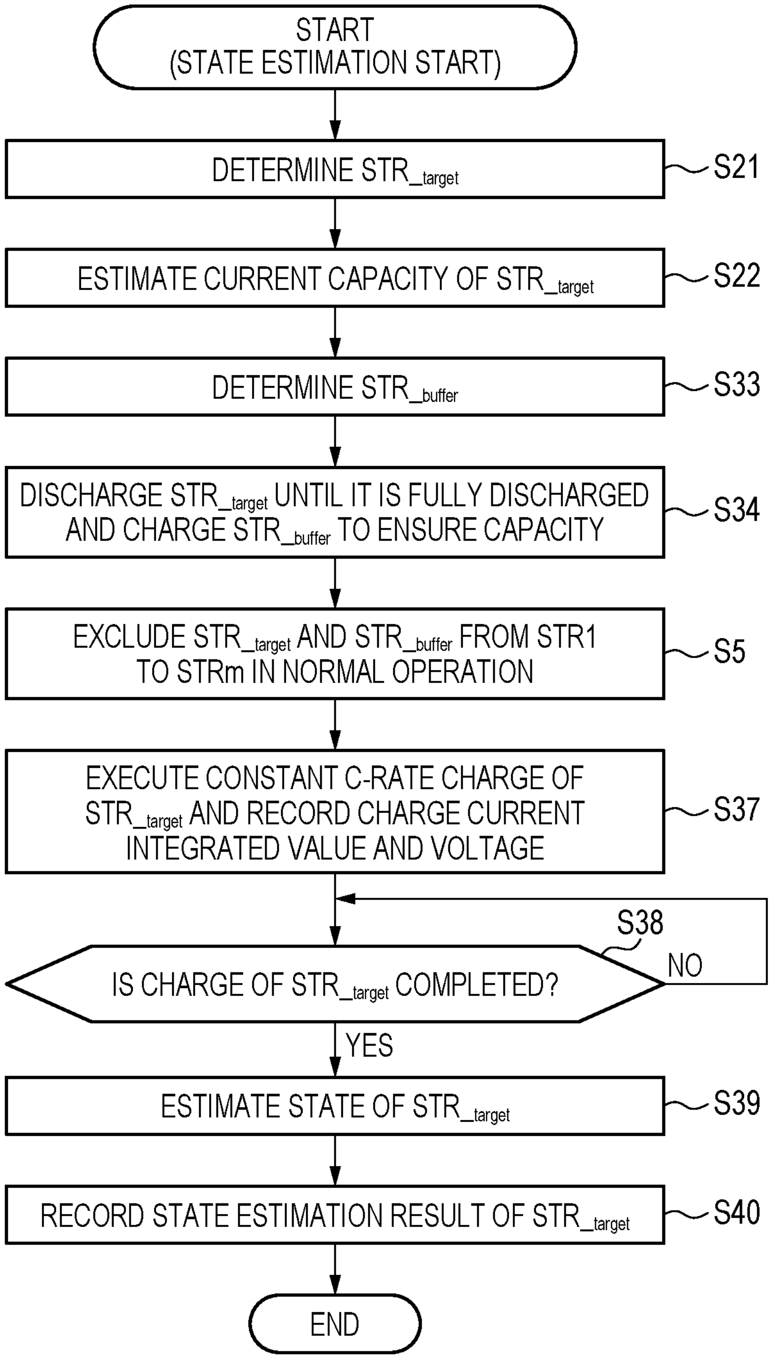
FIG. 6 is a flowchart illustrating another example of the state estimation processing on the target string performed by the storage battery control device in FIG. 4.

FIG. 6 is a flowchart illustrating another example of the state estimation processing on the target string $STR_{\_target}$ performed by the storage battery control device 200 in FIG. 4. For the same processing as that of the above-described embodiment, the description of the above-described example is incorporated.

As illustrated in the flowchart in FIG. 6, in step S21, the storage battery control device 200 determines one target string $STR_{\_target}$ from the m sets of storage battery strings STR1 to STRm. Next, in step S22, the storage battery control device 200 estimates a current battery capacity of the target string $STR_{\_target}$ determined in step S21.

Next, in step S33, the storage battery control device 200 determines the buffer string $STR_{\_buffer}$ that provides charge power of the target string $STR_{\_target}$ from the storage battery strings STR1 to STRm excluding the target string $STR_{\_target}$.

Next, in step S34, by controlling the power converters PC1 to PCm, the storage battery control device 200 discharges the target string $STR_{\_target}$ to a fully discharged state while executing a normal operation of the power storage system 1. By controlling the power converters PC1 to PCm, the storage battery control device 200 charges the buffer string $STR_{\_buffer}$ to ensure a discharge capacity in the buffer string $STR_{\_buffer}$ while executing the normal operation of the power storage system 1. The discharge capacity is equal to or larger than the battery capacity of the target string $STR_{\_target}$, and is set by the storage battery control device 200 based on the estimation result of the current battery capacity of the target string $STR_{\_target}$ in step S32.

Next, in step S5, the storage battery control device 200 excludes the target string $STR_{\_target}$ and the buffer string $STR_{\_buffer}$ from the storage battery strings STR1 to STRm used in the normal operation of the power storage system 1. That is, by controlling the power converters PC1 to PCm, the storage battery control device 200 continues the normal operation by using the storage battery strings STR1 to STRm excluding the target string $STR_{\_target}$ and the buffer string $STR_{\_buffer}$.

Next, in step S37, the storage battery control device 200 starts constant C-rate charge at a low current by the target string $STR_{\_target}$. The storage battery control device 200 records an integrated value of a charge current and a voltage of the target string $STR_{\_target}$ during the charge of the target string $STR_{\_target}$.

Here, when there is an input request from the external system to the power storage system 2, the storage battery control device 200 controls the power converters PC1 to PCm such that the target string $STR_{\_target}$ is charged from the external system. On the other hand, when there is no input request from the external system to the power storage system 2, the storage battery control device 200 controls the power converters PC1 to PCm such that the buffer string $STR_{\_buffer}$ is discharged to the target string $STR_{\_target}$.

Next, in step S38, the storage battery control device 200 determines whether the charge of the target string $STR_{\_target}$ is completed. Until an affirmative determination is made in step S38, the charge of the target string $STR_{\_target}$ is continued, and the recording of the integrated value of the charge current and the voltage of the target string $STR_{\_target}$ is continued. When the affirmative determination is made in step S38, the processing proceeds to step S39.

In step S39, the storage battery control device 200 estimates a state of the target string $STR_{\_target}$ based on the recorded integrated value of the charge current and the recorded voltage of the target string $STR_{\_target}$. Examples of the state estimation include estimation of the SOH and the generation of the SOC-OCV curve. Next, in step S40, the storage battery control device 200 records the result of the state estimation of the target string $STR_{\_target}$ in step S39. Thus, the processing illustrated in the flowchart in FIG. 6 is ended.

As described above, the storage battery control device 200 according to the present embodiment determines the target string $STR_{\_target}$ whose state is to be estimated. In addition, the storage battery control device 200 determines the buffer string $STR_{\_buffer}$ from the plurality of storage battery strings STR1 to STRm excluding the target string $STR_{\_target}$. The buffer string $STR_{\_buffer}$ provides the charge power of the target string $STR_{\_target}$. The storage battery control device 200 discharges the target string $STR_{\_target}$ and charges the buffer string $STR_{\_buffer}$ to ensure a capacity capable of providing the charge power of the target string $STR_{\_target}$ in the buffer string $STR_{\_buffer}$. The storage battery control device 200 discharges the buffer string $STR_{\_buffer}$ or the external system to the target string $STR_{\_target}$ to measure the charge current and the voltage of the target string $STR_{\_target}$. Then, the storage battery control device 200 estimates the state of the target string $STR_{\_target}$ based on the measured charge current and the measured voltage of the target string $STR_{\_target}$.

Here, during the state estimation processing, the storage battery strings STR1 to STRm other than the target string $STR_{\_target}$ are operated according to a request of the input and output to and from the external system, and change the charge and discharge current. In contrast, during the state estimation processing, the target string $STR_{\_target}$ can be charged from the buffer string $STR_{\_buffer}$ or the external system at the constant C-rate regardless of the request of the input and output to and from the external system. Accordingly, during the state estimation processing, a change in the charge current of the target string $STR_{\_target}$ can be reduced to be relatively small as compared with the storage battery strings STR1 to STRm other than the target string $STR_{\_target}$. Therefore, according to the storage battery control device 200 of the present embodiment, the state of the target string $STR_{\_target}$ can be accurately estimated regardless of a state of the request of the input and output to and from the power storage system 1.

Although the present disclosure has been described above based on the embodiments, the present disclosure is not limited to the embodiments. Modifications may be made without departing from the gist of the present disclosure, and publicly known or well-known techniques may be appropriately combined.

For example, in the above-described embodiment, the target storage battery module $M_{\_target}$ or the target string $STR_{\_target}$ is fully charged or fully discharged, and then the constant C-rate discharge or the constant C-rate charge is executed. However, it is not essential to fully charge or fully discharge the target storage battery module $M_{\_target}$ or the target string $STR_{\_target}$, and a charge amount or a discharge amount of the target storage battery module $M_{\_target}$ or the target string $STR_{\_target}$ may be appropriately set.

In the above-described embodiment, from the storage battery strings STR1 to STRm including the bypass circuits B1 to Bn, one target storage battery module $M_{\_target}$ is determined, and the state estimation is executed on the one target storage battery module $M_{\_target}$. However, from the storage battery strings STR1 to STRm including the bypass circuits B1 to Bn, a plurality of target storage battery module $M_{\_target}$ may be determined, and the state estimation may be simultaneously executed for the plurality of target storage battery module $M_{\_target}$. In this case, it is preferable to interrupt the recording of the integrated value of the charge and discharge current and the voltage of the target storage battery module $M_{\_target}$ at a timing at which the storage battery modules M1 to Mn are bypassed by the bypass circuits B1 to Bn.

In the above-described embodiment, the charge and discharge current and the voltage of the target storage battery module $M_{\_target}$ or the target string $STR_{\_target}$ are measured and recorded. However, one of the charge and discharge current and the voltage of the target storage battery module $M_{\_target}$ or the target string $STR_{\_target}$ may be measured and recorded.

Further, in the above-described embodiment, the target string $STR_{\_target}$ and the buffer string $STR_{\_buffer}$ are excluded from the storage battery strings STR1 to STRm used in the normal operation of the power storage system 1. However, when an acceptance capacity can be ensured as a buffer of the buffer string $STR_{\_buffer}$, the buffer string $STR_{\_buffer}$ may simultaneously implement a buffer function and a normal operation function.

An aspect of the present disclosure, a storage battery control device (100, 200) controls a power storage system (1, 2). The power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, and a plurality of power converters (PC1 to PCm) each provided between the storage battery string (STR1 to STRm) and the power line (3) and configured to convert an input and output voltage of the storage battery string (STR1 to STRm). The storage battery control device (100, 200) is configured to determine target storage battery ($M_{\_target}$) that are the storage batteries (M1 to Mn) whose state is to be estimated, determine a buffer string ($STR_{\_buffer}$) that is one of the storage battery strings (STR1 to STRm) and configured to receive discharge power of the target storage battery ($M_{\_target}$) from the plurality of storage battery strings (STR1 to STRm) excluding a target string ($STR_{\_target}$) that is one of the storage battery strings including the target storage battery ($M_{\_target}$), charge the target storage battery ($M_{\_target}$), discharge the buffer string ($STR_{\_buffer}$) to ensure a capacity capable of receiving the discharge power of the target storage battery ($M_{\_target}$) in the buffer string ($STR_{\_buffer}$), discharge the target storage battery ($M_{\_target}$) to the buffer string ($STR_{\_buffer}$) or an outside of the power storage system (1, 2) to measure at least one of a discharge current and a voltage of the target storage battery ($M_{\_target}$), and estimate a state of the target storage battery ($M_{\_target}$) based on at least one of the measured discharge current and the measured voltage of the target storage battery ($M_{\_target}$).

An aspect of the present disclosure, the storage battery string (STR1 to STRm) includes a bypass circuit (B1 to Bn) configured to bypass the storage battery (M1 to Mn). The storage battery control device (100, 200) is configured to determine the target storage battery ($M_{\_target}$), charge the target storage battery ($M_{\_target}$) in a state of bypassing the storage battery (M1 to Mn) excluding the target storage battery ($M_{\_target}$) of the target string ($STR_{\_target}$) by the bypass circuit (B1 to Bn), and discharge the target storage battery ($M_{\_target}$) to the buffer string ($STR_{\_buffer}$) or the outside of the power storage system (1, 2) to measure at least one of the discharge current and the voltage of the target storage battery ($M_{\_target}$) in the state of bypassing the storage battery (M1 to Mn) excluding the target storage battery ($M_{\_target}$) of the target string ($STR_{\_target}$) by the bypass circuit (B1 to Bn).

An aspect of the present disclosure, a storage battery control device (100, 200) that controls a power storage system (1, 2). The power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, and a plurality of power converters (PC1 to PCm) each provided between the storage battery string (STR1 to STRm) and the power line (3) and configured to convert an input and output voltage of the storage battery string (STR1 to STRm). The storage battery control device (100, 200) is configured to determine target storage battery ($M_{\_target}$) that are the storage batteries (M1 to Mn) whose state is to be estimated, determine a buffer string ($STR_{\_buffer}$) that is one of the storage battery strings (STR1 to STRm) and configured to provide charge power of the target storage battery ($M_{\_target}$) from the plurality of storage battery strings (STR1 to STRm) excluding a target string ($STR_{\_target}$) that is one of the storage battery strings including the target storage battery ($M_{\_target}$), discharge the target storage battery ($M_{\_target}$), charge the buffer string ($STR_{\_buffer}$) to ensure a capacity capable of providing the charge power of the target storage battery ($M_{\_target}$) in the buffer string ($STR_{\_buffer}$), discharge the buffer string ($STR_{\_buffer}$) or an outside of the power storage system (1, 2) to the target storage battery ($M_{\_target}$) to measure at least one of a charge current and a voltage of the target storage battery ($M_{\_target}$), and estimate a state of the target storage battery ($M_{\_target}$) based on at least one of the measured charge current and the measured voltage of the target storage battery ($M_{\_target}$).

An aspect of the present disclosure, the storage battery string (STR1 to STRm) includes a bypass circuit (B1 to Bn) configured to bypass the storage battery (M1 to Mn). The storage battery control device (100, 200) is configured to determine the target storage battery ($M_{\_target}$), discharge the target storage battery ($M_{\_target}$) in a state of bypassing the storage battery (M1 to Mn) excluding the target storage battery ($M_{\_target}$) of the target string ($STR_{\_target}$) by the bypass circuit (B1 to Bn), and discharge the buffer string ($STR_{\_buffer}$) or the outside of the power storage system (1, 2) to the target storage battery ($M_{\_target}$) to measure at least one of the charge current and the voltage of the target storage battery ($M_{\_target}$) in the state of bypassing the storage battery excluding the target storage battery ($M_{\_target}$) of the target string ($STR_{\_target}$) by the bypass circuit (B1 to Bn).

An aspect of the present disclosure, a power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, a plurality of power converters (PC1 to PCm) each provided between the storage battery string (STR1 to STRm) and the power line (3) and configured to convert an input and output voltage of the storage battery string (STR1 to STRm), and a storage battery control device (100, 200) configured to control the plurality of storage battery strings (STR1 to STRm) and the plurality of power converters (PC1 to PCm). The storage battery control device (100, 200) is configured to determine a target storage battery ($M_{\_target}$) that are the storage batteries (M1 to Mn) whose state is to be estimated, determine a buffer string ($STR_{\_buffer}$) that is one of the storage battery strings (STR1 to STRm) and configured to receive discharge power of the target storage battery ($M_{\_target}$) from the plurality of storage battery strings (STR1 to STRm) excluding a target string ($STR_{\_target}$) that is one of the storage battery strings including the target storage battery ($M_{\_target}$), charge the target storage battery ($M_{\_target}$), discharge the buffer string ($STR_{\_buffer}$) to ensure a capacity capable of receiving the discharge power of the target storage battery ($M_{\_target}$) in the buffer string ($STR_{\_buffer}$), discharge the target storage battery ($M_{\_target}$) to the buffer string ($STR_{\_buffer}$) or an outside of the power storage system (1, 2) to measure at least one of a discharge current and a voltage of the target storage battery ($M_{\_target}$), and estimate a state of the target storage battery ($M_{\_target}$) based on at least one of the measured discharge current and the measured voltage of the target storage battery ($M_{\_target}$).

An aspect of the present disclosure, a power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, a plurality of power converters (PC1 to PCm) each provided between the storage battery string (STR1 to STRm) and the power line (3) and configured to convert an input and output voltage of the storage battery string (STR1 to STRm), and a storage battery control device (100, 200) configured to control the plurality of storage battery strings (STR1 to STRm) and the plurality of power converters (PC1 to PCm). The storage battery control device (100, 200) is configured to determine target storage battery ($M_{\_target}$) that are the storage batteries (M1 to Mn) whose state is to be estimated, determine a buffer string ($STR_{\_buffer}$) that is one of the storage battery strings (STR1 to STRm) and configured to provide charge power of the target storage battery ($M_{\_target}$) from the plurality of storage battery strings (STR1 to STRm) excluding a target string ($STR_{\_target}$) that is one of the storage battery strings including the target storage battery ($M_{\_target}$), discharge the target storage battery ($M_{\_target}$), charge the buffer string ($STR_{\_buffer}$) to ensure a capacity capable of providing the charge power of the target storage battery ($M_{\_target}$) in the buffer string ($STR_{\_buffer}$), discharge the buffer string ($STR_{\_buffer}$) or an outside of the power storage system (1, 2) to the target storage battery ($M_{\_target}$) to measure at least one of a charge current and a voltage of the target storage battery ($M_{\_target}$), and estimate a state of the target storage battery ($M_{\_target}$) based on at least one of the measured charge current and the measured voltage of the target storage battery ($M_{\_target}$).

An aspect of the present disclosure, a storage battery control method is executed by using a storage battery control device (100, 200) configured to control a power storage system (1, 2). The power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, and a plurality of power converters (PC1 to PCm) each provided between the storage battery string (STR1 to STRm) and the power line (3) and configured to convert an input and output voltage of the storage battery string (STR1 to STRm). The storage battery control method includes determining a target storage battery ($M_{\_target}$) that is one of the storage batteries (M1 to Mn) whose state is to be estimated, determining a buffer string ($STR_{\_buffer}$) that is one of the storage battery strings (STR1 to STRm) and configured to receive discharge power of the target storage battery ($M_{\_target}$) from the plurality of storage battery strings (STR1 to STRm) excluding a target string ($STR_{\_target}$) that is one of the storage battery strings including the target storage battery ($M_{\_target}$), charging the target storage battery ($M_{\_target}$), discharging the buffer string ($STR_{\_buffer}$) to ensure a capacity capable of receiving the discharge power of the target storage battery ($M_{\_target}$) in the buffer string ($STR_{\_buffer}$), discharging the target storage battery ($M_{\_target}$) to the buffer string ($STR_{\_buffer}$) or an outside of the power storage system (1, 2) to measure at least one of a discharge current and a voltage of the target storage battery ($M_{\_target}$), and estimating a state of the target storage battery ($M_{\_target}$) based on at least one of the measured discharge current and the measured voltage of the target storage battery ($M_{\_target}$).

An aspect of the present disclosure, a storage battery control method is executed by using a storage battery control device (100, 200) configured to control a power storage system (1, 2). The power storage system (1, 2) includes a plurality of storage battery strings (STR1 to STRm) each including a plurality of storage batteries (M1 to Mn) and connected with each other by a power line (3), the plurality of storage batteries (M1 to Mn) being connected in series, and a plurality of power converters (PC1 to PCm) each provided between the storage battery string (STR1 to STRm) and the power line (3) and configured to convert an input and output voltage of the storage battery string (STR1 to STRm). The storage battery control method includes determining a target storage battery ($M_{\_target}$) that is one of the storage batteries (M1 to Mn) whose state is to be estimated, determining a buffer string ($STR_{\_buffer}$) that is one of the storage battery string (STR1 to STRm) and configured to provide charge power of the target storage battery ($M_{\_target}$) from the plurality of storage battery strings (STR1 to STRm) excluding a target string ($STR_{\_target}$) that is one of the storage battery string including the target storage battery ($M_{\_target}$), discharging the target storage battery ($M_{\_target}$), charging the buffer string ($STR_{\_buffer}$) to ensure a capacity capable of providing the charge power of the target storage battery ($M_{\_target}$) in the buffer string ($STR_{\_buffer}$), discharging the buffer string ($STR_{\_buffer}$) or an outside of the power storage system (1, 2) to the target storage battery ($M_{\_target}$) to measure at least one of a charge current and a voltage of the target storage battery ($M_{\_target}$), and estimating a state of the target storage battery ($M_{\_target}$) based on at least one of the measured charge current and the measured voltage of the target storage battery ($M_{\_target}$).

What is claimed is:

1. A storage battery control device that controls a power storage system, the power storage system comprising:

a plurality of storage battery strings each including a plurality of storage batteries and connected with each other by a power line, the plurality of storage batteries being connected in series, and a plurality of power converters each provided between the power line and a respective one of the storage battery strings and configured to convert an input and output voltage of the respective one of the storage battery strings, wherein the storage battery control device is configured to:

determine a target storage battery that is one of the storage batteries whose state is to be estimated;

determine a buffer string, configured to receive discharge power of the target storage battery, from the plurality of storage battery strings excluding a target string that is one of the storage battery strings including the target storage battery;

charge the target storage battery;

discharge the buffer string separately from charging the target storage battery and down to a power capacity that is greater than or equal to a battery capacity of the target storage battery;

discharge the target storage battery to the buffer string or an outside of the power storage system to measure at least one of a discharge current and a voltage of the target storage battery; and estimate a state of the target storage battery based on at least one of the measured discharge current and the measured voltage of the target storage battery.

2. The storage battery control device according to claim 1, wherein each of the storage battery strings includes a bypass circuit configured to bypass the storage batteries, and the storage battery control device is configured to:

determine the target storage battery, charge the target storage battery in a state of bypassing the storage batteries of the target string by the bypass circuit, excluding the target storage battery, and discharge the target storage battery to the buffer string or the outside of the power storage system to measure at least one of the discharge current and the voltage of the target storage battery in the state of bypassing the storage batteries of the target string by the bypass circuit, excluding the target storage battery.

3. A storage battery control device that controls a power storage system, the power storage system comprising:

a plurality of storage battery strings each including a plurality of storage batteries and connected with each other by a power line, the plurality of storage batteries being connected in series, and a plurality of power converters each provided between the power line and a respective one of the storage battery strings and configured to convert an input and output voltage of the respective one of the storage battery strings, wherein the storage battery control device is configured to:

determine a target storage battery that is one the storage batteries whose state is to be estimated;

determine a buffer string, configured to provide charge power to the target storage battery, from the plurality of storage battery strings excluding a target string that is one of the storage battery strings including the target storage battery;

discharge the target storage battery;

charge the buffer string to ensure a capacity capable of providing the charge power to the target storage battery in the buffer string;

discharge the buffer string or an outside of the power storage system to the target storage battery to measure at least one of a charge current and a voltage of the target storage battery; and estimate a state of the target storage battery based on at least one of the measured charge current and the measured voltage of the target storage battery.

4. The storage battery control device according to claim 3, wherein each of the storage battery strings includes a bypass circuit configured to bypass the storage batteries, and the storage battery control device is configured to:

determine the target storage battery;

discharge the target storage battery in a state of bypassing the storage batteries of the target string by the bypass circuit, excluding the target storage battery; and discharge the buffer string or the outside of the power storage system to the target storage battery to measure at least one of the charge current and the voltage of the target storage battery in the state of bypassing the storage batteries of the target string by the bypass circuit, excluding the target storage battery.

5. A power storage system comprising:

a plurality of storage battery strings each including a plurality of storage batteries and connected with each other by a power line, the plurality of storage batteries being connected in series;

a plurality of power converters each provided between the power line and a respective one of the storage battery strings and configured to convert an input and output voltage of the respective one of the storage battery strings; and a storage battery control device configured to control the plurality of storage battery strings and the plurality of power converters, wherein the storage battery control device is configured to:

determine a target storage battery that is one of the storage batteries whose state is to be estimated;

determine a buffer string, configured to receive discharge power of the target storage battery, from the plurality of storage battery strings excluding a target string that is one of the storage battery strings including the target storage battery;

charge the target storage battery;

discharge the buffer string separately from charging the target storage battery and down to a power capacity that is greater than or equal to a battery capacity of the target storage battery;

discharge the target storage battery to the buffer string or an outside of the power storage system to measure at least one of a discharge current and a voltage of the target storage battery; and estimate a state of the target storage battery based on at least one of the measured discharge current and the measured voltage of the target storage battery.

6. A power storage system comprising:

a plurality of storage battery strings each including a plurality of storage batteries and connected with each other by a power line, the plurality of storage batteries being connected in series;

a plurality of power converters each provided between the power line and a respective one of the storage battery strings and configured to convert an input and output voltage of the respective one of the storage battery string; and a storage battery control device configured to control the plurality of storage battery strings and the plurality of power converters, wherein the storage battery control device is configured to:

determine a target storage battery that is one of the storage batteries whose state is to be estimated;

determine a buffer string, configured to provide charge power to the target storage battery, from the plurality of storage battery strings excluding a target string that is one of the storage battery strings including the target storage battery;

discharge the target storage battery;

charge the buffer string to ensure a capacity capable of providing the charge power to the target storage battery in the buffer string;

discharge the buffer string or an outside of the power storage system to the target storage battery to measure at least one of a charge current and a voltage of the target storage battery, and estimate a state of the target storage battery based on at least one of the measured charge current and the measured voltage of the target storage battery.

7. A storage battery control method executed by using a storage battery control device configured to control a power storage system, the power storage system including:

a plurality of storage battery strings each including a plurality of storage batteries and connected with each other by a power line, the plurality of storage batteries being connected in series; and a plurality of power converters each provided between the power line and a respective one of the storage battery strings and configured to convert an input and output voltage of the respective one of the storage battery strings, the storage battery control method comprising:

determining a target storage battery that is one of the storage batteries whose state is to be estimated;

determining a buffer string, configured to receive discharge power of the target storage battery, from the plurality of storage battery strings excluding a target string that is one of the storage battery strings including the target storage battery;

charging the target storage battery;

discharging the buffer string separately from charging the target storage battery and down to a power capacity that is greater than or equal to a battery capacity of the target storage battery;

discharging the target storage battery to the buffer string or an outside of the power storage system to measure at least one of a discharge current and a voltage of the target storage battery; and estimating a state of the target storage battery based on at least one of the measured discharge current and the measured voltage of the target storage battery.

8. A storage battery control method executed by using a storage battery control device configured to control a power storage system, the power storage system including:

a plurality of storage battery strings each including a plurality of storage batteries and connected with each other by a power line, the plurality of storage batteries being connected in series; and a plurality of power converters each provided between the storage battery string and the power line and configured to convert an input and output voltage of the storage battery string, the storage battery control method comprising:

determining a target storage battery that is one of the storage batteries whose state is to be estimated;

determining a buffer string, configured to provide charge power to the target storage battery, from the plurality of storage battery strings excluding a target string that is one of the storage battery strings including the target storage battery;

discharging the target storage battery;

charging the buffer string to ensure a capacity capable of providing the charge power to the target storage battery in the buffer string;

discharging the buffer string or an outside of the power storage system to the target storage battery to measure at least one of a charge current and a voltage of the target storage battery; and estimating a state of the target storage battery based on at least one of the measured charge current and the measured voltage of the target storage battery.

* * * * *